(12) United States Patent
Aoyama et al.

(10) Patent No.: US 9,523,023 B2
(45) Date of Patent: Dec. 20, 2016

(54) ADHESIVE SHEET

(71) Applicant: FURUKAWA ELECTRIC CO., LTD., Tokyo (JP)

(72) Inventors: Masami Aoyama, Tokyo (JP); Hiromitsu Maruyama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/505,329

(22) Filed: Oct. 2, 2014

(65) Prior Publication Data

US 2015/0017374 A1 Jan. 15, 2015

Related U.S. Application Data

(63) Continuation of application No. PCT/JP2013/059324, filed on Mar. 28, 2013.

(30) Foreign Application Priority Data

Apr. 2, 2012 (JP) .................. 2012-083640

(51) Int. Cl.
C09J 7/02 (2006.01)
H01L 21/683 (2006.01)
C09J 133/08 (2006.01)

(52) U.S. Cl.
CPC ............... *C09J 7/0217* (2013.01); *C09J 7/02* (2013.01); *C09J 133/08* (2013.01);
(Continued)

(58) Field of Classification Search
None
See application file for complete search history.

(56) References Cited

U.S. PATENT DOCUMENTS 5,088,126 A * 2/1992 Mathis ............... A42B 3/10
2/181
D621,803 S 8/2010 Maruyama et al.
(Continued)

FOREIGN PATENT DOCUMENTS

CN 101814432 A 8/2010
JP 2004-266163 9/2004
(Continued)

OTHER PUBLICATIONS

U.S. Appl. No. 14/505,352, filed Oct. 2, 2014, Aoyama, et al.
(Continued)

*Primary Examiner* — Humera Sheikh
*Assistant Examiner* — Elaine M Vazquez
(74) *Attorney, Agent, or Firm* — Oblon, McClelland, Maier & Neustadt, L.L.P.

(57) ABSTRACT

An adhesive sheet 10 wound into a roll includes: a long release film 11; an adhesive layer 12 provided in a label form on the release film 11; and a pressure-sensitive adhesive film 13 having a label part 13*a* covering the adhesive layer 12 and provided so as to be in contact with the release film 11 around the adhesive layer 12 and a peripheral part 13*b* surrounding an outside of the label part 13*a*, wherein a through hole 14 penetrating the release film 11 is provided in a place including a portion corresponding to an outside of a part 15 of the adhesive layer 12 intended to be attached to an adherend and an inside of the label part 13*a*.

9 Claims, 9 Drawing Sheets

(52) U.S. Cl.
CPC ....... *H01L 21/6836* (2013.01); *C09J 2201/20* (2013.01); *C09J 2201/36* (2013.01); *C09J 2201/606* (2013.01); *C09J 2203/326* (2013.01); *C09J 2433/00* (2013.01); *H01L 2221/68327* (2013.01); *H01L 2221/68336* (2013.01); *H01L 2221/68377* (2013.01); *Y10T 428/1476* (2015.01)

(56) References Cited

U.S. PATENT DOCUMENTS

| | | |
|---|---|---|
| D628,170 S | 11/2010 | Maruyama et al. |
| 8,465,615 B2 | 6/2013 | Tanaka et al. |
| 8,470,115 B2 | 6/2013 | Tanaka et al. |
| 2008/0261039 A1 | 10/2008 | Tanaka et al. |
| 2010/0227165 A1 | 9/2010 | Maruyama et al. |
| 2012/0068312 A1 | 3/2012 | Tanaka et al. |
| 2012/0073743 A1 | 3/2012 | Tanaka et al. |
| 2012/0094471 A1 | 4/2012 | Taniguchi et al. |
| 2012/0100325 A1 | 4/2012 | Maruyama et al. |
| 2012/0135176 A1 | 5/2012 | Tanaka et al. |
| 2013/0295314 A1 | 11/2013 | Tanaka et al. |
| 2013/0302570 A1 | 11/2013 | Tanaka et al. |

FOREIGN PATENT DOCUMENTS

| | | |
|---|---|---|
| JP | 2006-344932 | 12/2006 |
| JP | 2007-002173 | 1/2007 |
| JP | 2008-153587 | 7/2008 |
| JP | 2009-256458 | 11/2009 |
| JP | 2009-275222 | 11/2009 |
| JP | 4785093 B2 | 7/2011 |
| JP | 2012-049473 | 3/2012 |
| JP | 2012-049474 | 3/2012 |
| KR | 10-2007-0053326 A | 5/2007 |
| WO | 2012/050134 | 4/2012 |

OTHER PUBLICATIONS

U.S. Appl. No. 14/505,143, filed Oct. 2, 2014, Aoyama, et al.
International Search Report issued Apr. 23, 2013 in PCT/JP2013/059324 filed Mar. 28, 2013.
Office Action issued on Jul. 6, 2012 in Japanese Patent Application No. 2012-083640 (W/English Translation).
Office Action issued on Oct. 12, 2012 in Japanese Patent Application No. 2012-083640 (W/English Translation).
Combined Office Action and Search Report issued Oct. 31, 2014 in Chinese Patent Application No. 201380002906.0.
Office Action issued Dec. 3, 2014 in Taiwanese Patent Application No. 102110886 (with English translation).
Office Action issued Jun. 9, 2015 in Chinese Patent Application No. 201380002906.0 (with English language translation).
Korean Office Action issued Mar. 13, 2015 in Patent Application No. 10-2014-7002007 (with Partial English Translation).

* cited by examiner

| FIG. 9A | FIG. 9B | FIG. 9C | FIG. 9D |
|---|---|---|---|
| 0.1mm | 1mm | 0.01mm | 30mm |

ADHESIVE SHEET

CROSS-REFERENCE TO RELATED APPLICATIONS

This application is a Continuation of PCT/JP2013/059324 filed on Mar. 28, 2013. This application is based upon and claims the benefit of priority to Japanese Application No. 2012-083640 filed on Apr. 2, 2012.

BACKGROUND OF THE INVENTION

1. Technical Field

The present invention relates to an adhesive sheet, and more particularly relates to an adhesive sheet having two functions of a dicing tape and a die bonding film.

2. Background Art

Recently, an adhesive sheet has been developed, which has two functions of a dicing tape for fixing a semiconductor wafer to dice the semiconductor wafer into individual chips and a die bonding film (also referred to as a die attach film) for bonding the diced semiconductor chip to a lead frame, a package substrate, or the like or for stacking and bonding together the semiconductor chips in a stacked package.

As such an adhesive sheet, a precut adhesive sheet has been developed in consideration of workability such as attachability to a wafer or attachability to a ring frame before dicing (see, for example, Patent Literature 1).

An example of the precut adhesive sheet is shown in FIGS. 11, 12A and 12B. FIG. 11 is a diagram showing an adhesive sheet wound into a roll, FIG. 12A is a plan view of the adhesive sheet viewed from its pressure-sensitive adhesive film 53 side, and FIG. 12B is a sectional view taken along a line B-B of FIG. 12A. The adhesive sheet 50 includes a release film 51, an adhesive layer 52, and a pressure-sensitive adhesive film 53. The adhesive layer 52 is processed into a circular shape corresponding to the shape of a wafer, and has a circular label shape. The pressure-sensitive adhesive film 53 is formed by removing an area peripheral to a circular portion corresponding to the shape of a ring frame for dicing, and, as shown in the drawings, has a circular label part 53a and a peripheral part 53b surrounding the outside of the circular label part 53a. The adhesive layer 52 and the circular label part 53a of the pressure-sensitive adhesive film 53 are laminated together so that their centers are aligned, and the circular label part 53a of the pressure-sensitive adhesive film 53 covers the adhesive layer 52 and is in contact with the release film 51 around the adhesive layer 52. The pressure-sensitive adhesive film 53 is generally formed by laminating a pressure-sensitive adhesive layer on a base film.

Before wafer dicing, the release film 51 is peeled off from the adhesive layer 52 and the pressure-sensitive adhesive film 53 laminated together, and as shown in FIG. 13, the backside of a semiconductor wafer W is attached onto the adhesive layer 52, and a ring frame F for dicing is adherently fixed to the outer periphery of the circular label part 53a of the pressure-sensitive adhesive film 53. In this state, the semiconductor wafer W is diced. Then, the pressure-sensitive adhesive film 53 is subjected to curing treatment such as irradiation with ultraviolet rays, if necessary, and semiconductor chips are picked up. At this time, the pressure-sensitive adhesive film 53 is separated from the adhesive layer 52 so that the semiconductor chip is picked up with the adhesive layer 52 being attached to its backside. The adhesive layer 52 attached to the backside of the semiconductor chip then functions as a die bonding film when the semiconductor chip is bonded to a lead frame, a package substrate, or another semiconductor chip.

Meanwhile, the pressure-sensitive adhesive film 53 generally covers the adhesive layer 52 and is in contact with the release film 51 around the adhesive layer 52, but there is a case where air remains in a very narrow gap created between the release film 51 and the pressure-sensitive adhesive film 53 due to the thickness of the adhesive layer 52. This phenomenon is more remarkable when the adhesive layer 52 has a thickness as large as 60 μm or more or the pressure-sensitive adhesive film 53 has a high elastic modulus. Such air between the release film 51 and the pressure-sensitive adhesive film 53 does not cause a problem by itself, because the air may move and escape to the outside of the circular label part 53a and does not have a major impact on the physical properties of the pressure-sensitive adhesive film 53.

However, the adhesive sheet 50 is to be placed in a special environment whose temperature varies widely. For example, the adhesive sheet 50 is placed under cold conditions (e.g., −20° C. to 5° C.) during storage and transportation, heated when attached to the semiconductor wafer W, and placed under ordinary temperature conditions when used to process the semiconductor wafer W. Such a temperature change causes major dimensional changes in the release film 51, the adhesive layer 52, and the pressure-sensitive adhesive film 53, and therefore there is a case where air enters between the adhesive layer 52 and the pressure-sensitive adhesive film 53 so that a void is formed. There is a fear that the void causes defective attachment to the semiconductor wafer W and reduces yield in the subsequent semiconductor wafer W dicing process, chip pick-up process, and chip bonding process. It is to be noted that in this specification, the term air refers to air between a pressure-sensitive adhesive film and a release film or between an adhesive layer and a release film, and the term void refers to air between an adhesive layer and a pressure-sensitive adhesive film.

As described above, the void reduces yield and is formed between the adhesive layer 52 and the pressure-sensitive adhesive film 53 and is therefore difficult to remove, which is a very serious problem for the adhesive sheet 50. Further, in light of the principle of void formation, air is more likely to develop into a void when its amount is larger. For this reason, the amount of air is preferably reduced.

As a measure to suppress void formation, a laminated sheet has been disclosed (see, for example, FIGS. 1 and 2 in Patent Literature 2), which has through holes provided so as to penetrate a base film and a pressure-sensitive adhesive layer of a pressure-sensitive adhesive film in the thickness direction of the pressure-sensitive adhesive film. By providing such through holes in the pressure-sensitive adhesive film, it is possible to prevent void formation between an adhesive layer and the pressure-sensitive adhesive film, and therefore it can be expected that the occurrence of defective attachment to a semiconductor wafer will be effectively suppressed.

CITATION LIST

Patent Literatures

Patent Literature 1: JP 2007-2173 A
Patent Literature 2: JP 2008-153587 A

SUMMARY OF INVENTION

Technical Problem

Meanwhile, prior to the process of picking up the chips with adhesive layer from the pressure-sensitive adhesive layer, the process of expanding the pressure-sensitive adhesive film in a direction toward its periphery is performed to widen gaps between the chips to improve chip recognition by a CCD camera or the like and to prevent re-adhesion between the chips adjacent to each other during picking up the chips. In the expansion process, there is a case where the amount and/or rate of expansion need(s) to be increased to more reliably prevent the re-adhesion or to shorten takt time.

However, the adhesive sheet disclosed in Patent Literature 2 has through holes provided in the pressure-sensitive adhesive film, and therefore there is a problem that the pressure-sensitive adhesive film starts to tear at the through holes when the amount and/or rate of expansion are/is increased. Particularly, in light of the principle of void formation, providing through holes along the outer periphery of the adhesive layer is most effective, and therefore the wafer-processing tape disclosed in Patent Literature 2 has through holes provided along the outer periphery of the adhesive layer so as to penetrate the pressure-sensitive adhesive film. However, expandability during expansion is different between an area where the adhesive layer and the pressure-sensitive adhesive film are laminated together and an area where only the pressure-sensitive adhesive film is provided, and the maximum load is exerted on the outer periphery of the adhesive layer by expansion, and therefore the pressure-sensitive adhesive film is likely to tear during expansion.

It is therefore an object of the present invention to provide an adhesive sheet that can suppress void formation between an adhesive layer and a pressure-sensitive adhesive film to reduce the occurrence of defective attachment to a semiconductor wafer and that can be successfully expanded without tearing the pressure-sensitive adhesive film even when the amount and/or rate of expansion are/is increased.

Solution to Problem

In order to achieve the above object, the present invention is directed to an adhesive sheet wound into a roll, comprising: a long release film; an adhesive layer provided in a label form on the release film; and a pressure-sensitive adhesive film having a label part covering the adhesive layer and provided so as to be in contact with the release film around the adhesive layer and a peripheral part surrounding an outside of the label part, wherein a through hole penetrating the release film is provided in a place including a portion corresponding to an outside of a part of the adhesive layer intended to be attached to an adherend and an inside of the label part.

Further, it is preferred that in the adhesive sheet, a difference in linear expansion coefficient between the release film and the pressure-sensitive adhesive film is 250 ppm/K or less.

It is also preferred that in the adhesive sheet, the through hole is provided within an area of ±60° or less around a center of the adhesive layer with respect to a straight line passing through the center of the adhesive layer and perpendicular to a longitudinal direction of the release film.

It is also preferred that the adhesive sheet includes a support member provided outside the label part of the pressure-sensitive adhesive film along the longitudinal direction.

It is also preferred that in the adhesive sheet, the adhesive layer has a planar shape corresponding to an adherend to which the adhesive layer is to be attached after the release film is peeled off.

It is also preferred that in the adhesive sheet, the pressure-sensitive adhesive film has a planar shape corresponding to an adherend to which the pressure-sensitive adhesive film is to be attached after the release film is peeled off.

It is also preferred that in the adhesive sheet, the through hole is provided in a place including a portion in contact with an outer edge of the adhesive layer.

Advantageous Effects of Invention

According to the present invention, formation of void between the adhesive layer and the pressure-sensitive adhesive film can be suppressed to reduce the occurrence of defective attachment to a semiconductor wafer, and expansion can be successfully performed without tearing the pressure-sensitive adhesive film even when the amount and/or rate of expansion are/is increased.

BRIEF DESCRIPTION OF DRAWINGS

FIGS. 9A to 9D are diagrams showing the shape of through holes provided in an adhesive sheet according to Example or Comparative Example of the present invention.

DESCRIPTION OF EMBODIMENTS

First Embodiment

Figure 1A:
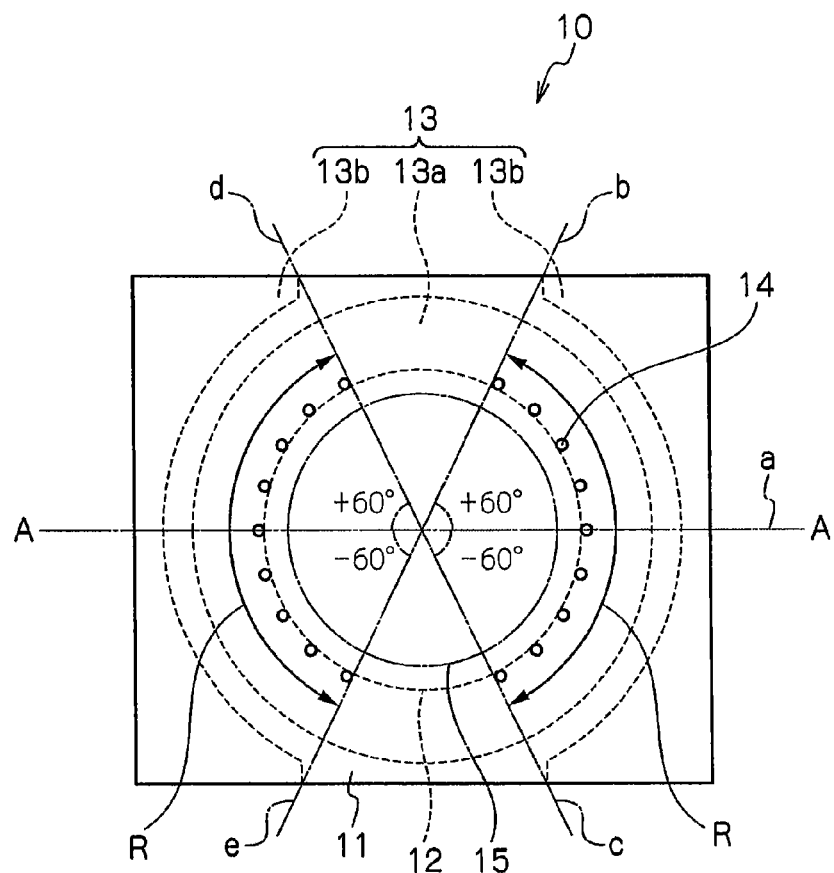
FIG. 1A is a plan view schematically showing the structure of an adhesive sheet according to an embodiment of the present invention.

Hereinbelow, embodiments of the present invention will be described in detail based on the accompanying drawings. FIG. 1A is a plan view of an adhesive sheet according to an embodiment of the present invention viewed from its release film side, and FIG. 1B is a sectional view taken along a line A-A of FIG. 1A.

Figure 1B:
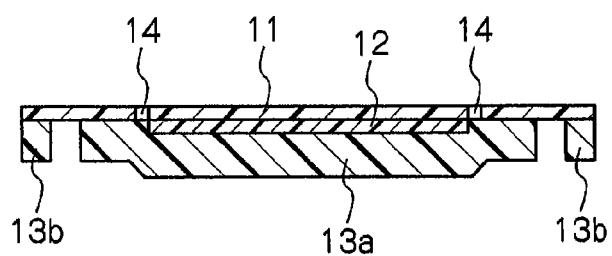
FIG. 1B is a sectional view taken along a line A-A of FIG. 1A.

As shown in FIGS. 1A and 1B, the adhesive sheet 10 is a wafer processing tape including a long release film 11, an adhesive layer 12, and a pressure-sensitive adhesive film 13 and having two functions of a dicing tape and a die bonding film.

The adhesive layer 12 is provided on a first surface of the release film 11 and has a circular label shape corresponding to the shape of a wafer. The pressure-sensitive adhesive film 13 has a circular label part 13a covering the adhesive layer 12 and provided so as to be in contact with the release film 11 around the adhesive layer 12 and a peripheral part 13b surrounding the outside of the circular label part 13a. The peripheral part 13b may be one completely surrounding the outside of the circular label part 13a or one incompletely surrounding the outside of the circular label part 13a as shown in FIGS. 1A and 1B. The circular label part 13a has a shape corresponding to a ring frame for dicing.

Hereinbelow, each of the components of the adhesive sheet 10 according to this embodiment will be described in detail.

(Release Film)

The release film 11 used in the adhesive sheet 10 according to the present invention is not particularly limited as long as a difference in linear expansion coefficient between the release film 11 and the pressure-sensitive adhesive film 13 is 250 ppm/K or less, and a well-known one such as a polyethylene terephthalate (PET)-based film, a polyethylene-based film, or a release-treated film can be used. The thickness of the release film 11 is not particularly limited and may be appropriately set, but is preferably 25 μm to 75 μm.

As shown in FIGS. 1A and 1B, the release film 11 has circular through holes. The through holes are provided so as to penetrate the release film 11 and to be in contact with the outer edge of the adhesive layer 12. The through holes 14 are provided within an area of ±60° or less around the center of the adhesive layer 12 with respect to a straight line a passing through the center of the adhesive layer 12 and perpendicular to the longitudinal direction of the release film 11 (i.e., within a region R inside a line b-c and a region R inside a line d-e shown in FIG. 1A).

Figure 2:
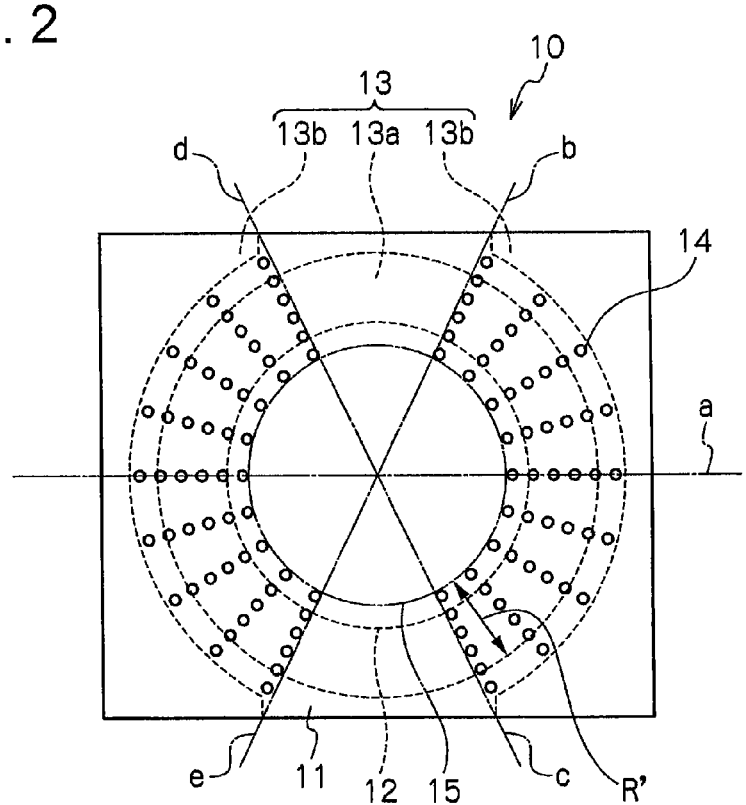
FIG. 2 is a plan view schematically showing the structure of a modified example of the adhesive sheet according to the embodiment of the present invention.

The place of the through holes 14 is not limited to a place in contact with the outer edge of the adhesive layer 12, but the through holes 14 shall be provided in a place including a portion corresponding to the outside of a part 15 of the adhesive layer 12 intended to be attached to an adherend and the inside of the circular label part 13a. For example, as shown in FIG. 2, the through holes 14 may be provided radially from a place in the release film 11 corresponding to the outer edge of the part 15 of the adhesive layer 12 intended to be attached to an adherend. It is to be noted that in this modified example, the circular through holes 14 are radially arranged, but may be randomly provided in a place including a portion corresponding to the outside of the part 15 of the adhesive layer 12 intended to be attached to an adherend and the inside of the circular label part 13a.

Here, the portion corresponding to the outside of the part 15 of the adhesive layer 12 intended to be attached to an adherend and the inside of the circular label part 13a refers to a region R' extending from a place in the release film 11 opposed to the outer edge of the part 15 of the adhesive layer 12 intended to be attached to an adherend to a place in the release film 11 opposed to the outer edge of the circular label part 13a.

Further, the part 15 of the adhesive layer 12 intended to be attached to an adherend is a place where a semiconductor wafer is to be attached when the semiconductor wafer is diced using the adhesive sheet 10, and is located, for example, 10 mm to 25 mm inside the outer edge of the adhesive layer 12.

Further, the place where the through holes 14 are provided is not particularly limited as long as the place includes a portion corresponding to the outside of the part 15 of the adhesive layer 12 intended to be attached to an adherend and the inside of the circular label part 13a, that is, the region R', and therefore as shown in FIG. 2, the through holes may be provided in the region R' and a place outside the region R'.

The through holes are intended to discharge a void itself that causes defective attachment to a semiconductor wafer or air at a stage prior to development into a void. For such a purpose, a void or air needs to be discharged to the outside of the part 15 of the adhesive layer 12 intended to be attached to a semiconductor wafer (adherend). When the through holes 14 are provided only in a portion corresponding to the inside of the part 15 of the adhesive layer 12 intended to be attached to an adherend or only in a portion corresponding to the outside of the circular label part 13a of the pressure-sensitive adhesive film 13, air remaining in a gap created between the release film 11 and the pressure-sensitive adhesive film 13 due to the thickness of the adhesive layer 12 or a void formed between the adhesive layer 12 and the pressure-sensitive adhesive film 13 by the entry of air due to dimensional changes in the release film 11, the adhesive layer 12, and the pressure-sensitive adhesive film 13 caused by temperature change cannot be discharged to the outside of the part 15 of the adhesive layer 12 intended to be attached to an adherend. For this reason, the through holes 14 need to be provided in a place including a portion corresponding to the outside of the part 15 of the adhesive layer 12 intended to be attached to an adherend and the inside of the circular label part 13a.

Further, providing the through holes 14 in a place corresponding to the outside of the adhesive layer 12 makes it possible to guide air so that the air travels in a direction toward the outside of the adhesive layer 12, which makes it possible to minimize the possibility that air enters between the adhesive layer 12 and the pressure-sensitive adhesive film 13 and develops into a void. Further, providing the through holes 14 in a portion in contact with the outer edge of the adhesive layer 12 is more effective, because this makes it possible not only to reduce the possibility that air develops into a void but also to immediately discharge air generated at the outer edge of the adhesive layer 12 to reduce air itself. Therefore, when the number of the through holes 14 needs to be minimized, the through holes 14 are preferably provided only in a portion in contact with the outer edge of the adhesive layer 12.

Figure 3:
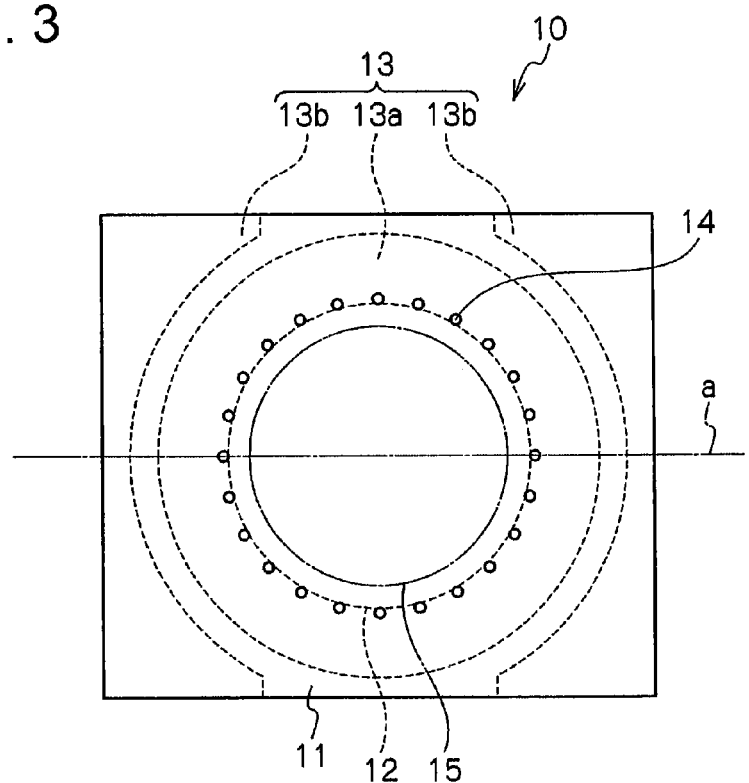
FIG. 3 is a plan view schematically showing the structure of another modified example of the adhesive sheet according to the embodiment of the present invention.

Further, the place where the through holes 14 are provided is not limited to an area of ±60° or less around the center of the adhesive layer 12 with respect to a straight line a passing through the center of the adhesive layer 12 and perpendicular to the longitudinal direction of the release film 11, and as shown in FIG. 3, the through holes 14 may be provided within an area of ±90° around the center of the adhesive layer with respect to the straight line a, that is, within the entire area around the center of the adhesive layer. However, the through holes 14 are preferably provided within an area of ±60° or less, more preferably ±45° or less around the center of the adhesive layer 12 with respect to the straight line a, because the adhesive sheet 10 is wound into a roll when prepared as a product, and therefore providing the through holes in the short direction of the release film 11 makes it possible to easily discharge air and to obtain a great void formation-suppressing effect.

Figure 6:
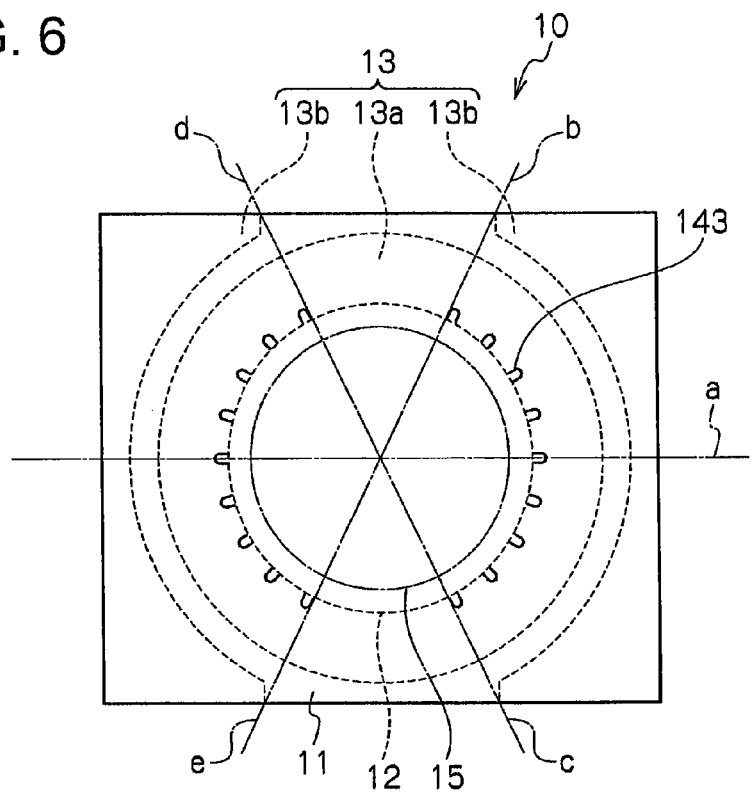
FIG. 6 is a plan view schematically showing the structure of another modified example of the adhesive sheet according to the embodiment of the present invention.
Figure 7:
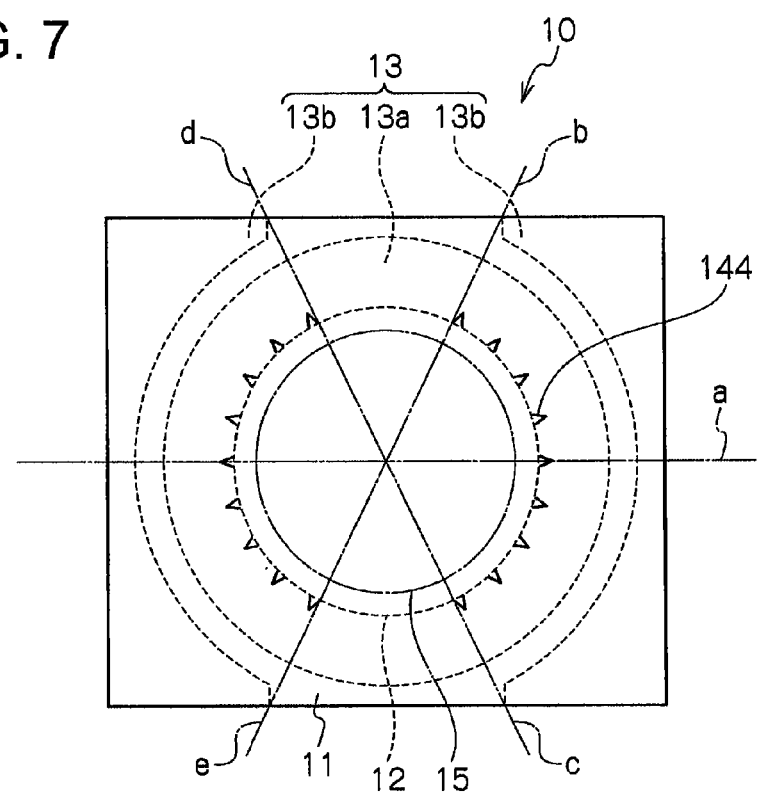
FIG. 7 is a plan view schematically showing the structure of another modified example of the adhesive sheet according to the embodiment of the present invention.

The shape of the through holes 14 is not limited to a circle as long as a void can be discharged, and may be a triangle, a rhombus, a line shape, or the like. However, from the viewpoint of preventing contamination of the adhesive layer 12, the through holes 14 preferably have a line shape. The through holes having a line shape may be, for example, through holes 141 having a straight line shape as shown in FIG. 4, wavy through holes 142 as shown in FIG. 5, U-shaped through holes 143 as shown in FIG. 6, or V-shaped through holes 144 as shown in FIG. 7.

The orientation of the through holes 14 is a design choice, but as will be described below, the present inventors have found a preferred orientation by experiment. More specifically, when the through holes have a circular shape or a regular polygonal shape, the orientation of the through holes is arbitrarily set. When the through holes have a shape other than "a circular shape or a regular polygonal shape" and when the through holes have a line shape or a wavy shape, the orientation of the through holes shall be set so that the longitudinal direction of the through holes is as parallel as possible to a tangent to the circle of label of the adhesive layer 12 or the pressure-sensitive adhesive film 13. When the through holes have a U-shape or a V-shape, the orientation of the through holes shall be set so that the convex side of the through holes is directed to the outside of the circle of the label. This makes it possible to easily discharge a void toward the outside.

Figure 4:
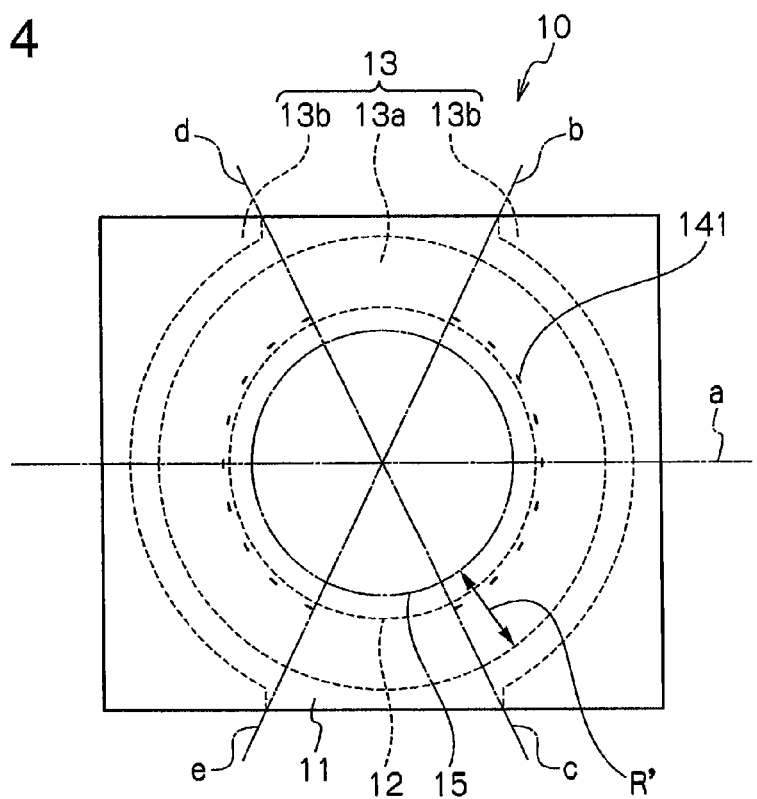
FIG. 4 is a plan view schematically showing the structure of another modified example of the adhesive sheet according to the embodiment of the present invention.
Figure 5:
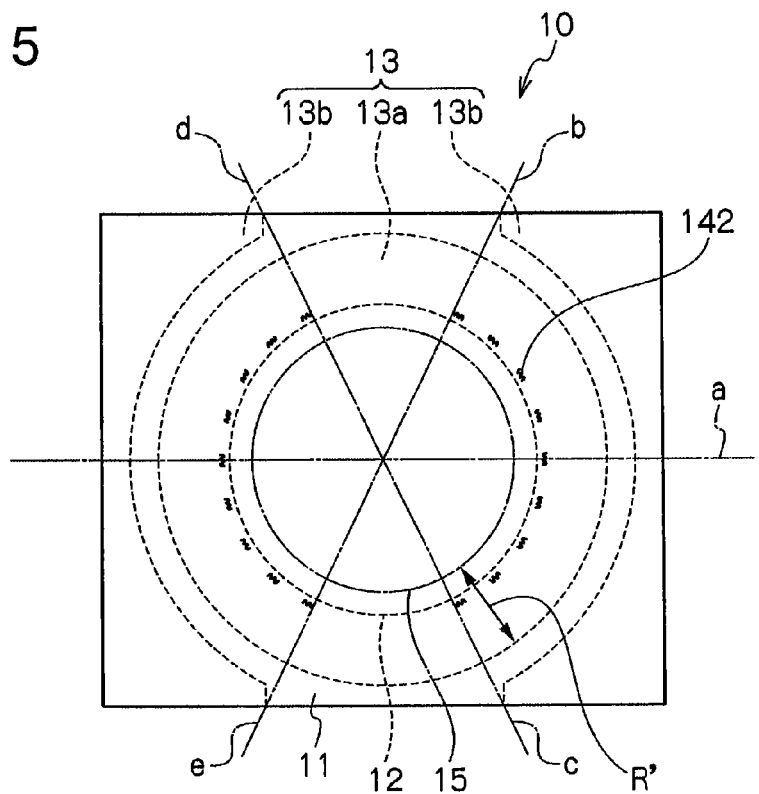
FIG. 5 is a plan view schematically showing the structure of another modified example of the adhesive sheet according to the embodiment of the present invention.

It is to be noted that in FIGS. 4 and 5, the through holes 141 and 142 are provided so that their longitudinal direction is parallel to a tangent to the circle of label of the adhesive layer 12 or the pressure-sensitive adhesive film 13, but may be provided so that their longitudinal direction is perpendicular to a tangent to the circle of label of the adhesive layer 12 or the pressure-sensitive adhesive film 13. In this case, the through holes 141 and 142 may be provided continuously so as to elongate in an area including the region R'.

Further, a combination of the above-described place and shape of the through holes 14 may be appropriately selected.

The maximum width of the through holes 14 is preferably 50 mm or less, more preferably 0.01 mm or more but 10 mm or less, even more preferably 0.1 mm or more but 5 mm or less. If the maximum width is less than 0.01 mm, a void is less likely to be discharged and if the maximum width exceeds 50 mm, air is likely to enter from the outside of the release film 11 and therefore there is a risk that void formation is adversely induced. When the through holes have a line shape, the maximum width refers to a length from start point to end point, and when the through holes have a shape other than a line shape, the maximum width refers to the longest distance within the hole.

The number of the through holes 14 is preferably 1 or more but 150 or less, more preferably 6 or more but 100 or less, even more preferably 8 or more but 64 or less per circular label part 13a of the pressure-sensitive adhesive film 13. If the number of the through holes 14 exceeds 150, air is likely to enter from the outside of the release film 11, and therefore there is a risk that void formation is adversely induced.

Further, when the number of the through holes 14 per circular label part 13a of the pressure-sensitive adhesive film 13 is an even number, arranging the through holes 14 so that they are symmetrical about the center of the adhesive layer 12 makes it possible to easily discharge air and to obtain a great void formation-suppressing effect.

There is no correlation between the maximum width and the number of the through holes 14, but in light of the fact that the through holes 14 are provided in a place corresponding to the outer edge of the adhesive layer 12, and are particularly preferably provided within an area of ±60° or less with respect to a straight line a passing through the center of the adhesive layer 12 and perpendicular to the longitudinal direction of the release film 11, the through holes 14 per circular label part 13a of the pressure-sensitive adhesive film 13 preferably satisfy maximum width×number<outer circumference of adhesive layer, more preferably satisfy maximum width×number<outer circumference of adhesive layer×$\frac{2}{3}$.

(Adhesive Layer)

As described above, the adhesive layer 12 according to the present invention is provided on the release film 11 and has a circular label shape corresponding to the shape of a wafer. The shape corresponding to the shape of a wafer may be a shape substantially the same as the shape of a wafer and substantially the same in size as the wafer, or alternatively may be a similar shape substantially the same as the shape of a wafer but larger in size than the wafer. The shape corresponding to the shape of a wafer does not always need to be a circle, but is preferably close to a circle, more preferably a circle.

The adhesive layer 12 is attached to the backside of a chip when the chip is picked up after a semiconductor wafer is attached to the adhesive layer 12 and diced, and is used as an adhesive to fix the chip to a substrate or a lead frame. As the adhesive layer 12, for example, a pressure-sensitive adhesive containing at least one selected from an epoxy-based resin, an acrylic resin, and a phenol-based resin can be preferably used. Besides the above, a polyimide-based resin or a silicone-based resin can also be used. The thickness of the adhesive layer may be appropriately set, but is preferably about 5 μm to 100 μm.

(Pressure-Sensitive Adhesive Film)

As described above, the pressure-sensitive adhesive film 13 according to the present invention has the circular label part 13a having a shape corresponding to the shape of a ring frame for dicing and the peripheral part 13b surrounding the outside of the circular label part 13a. Such a pressure-sensitive adhesive film can be formed by removing an area peripheral to the circular label part 13a from a film-shaped pressure-sensitive adhesive by precut processing. The shape corresponding to the shape of a ring frame for dicing is a similar shape substantially the same as the shape of the inside of a ring frame but larger in size than the inside of the ring frame. The shape corresponding to the shape of a ring frame for dicing does not always need to be a circle, but is preferably close to a circle, more preferably a circle.

The pressure-sensitive adhesive film 13 is not particularly limited as long as a difference in linear expansion coefficient between the release film 11 and the pressure-sensitive adhesive film 13 is 250 ppm/K or less, but shall have sufficient adhesive power during wafer dicing to prevent detachment of a wafer and have low adhesive power during picking-up of chips after dicing so as to be easily separated from the adhesive layer. For example, one obtained by providing a pressure-sensitive adhesive layer on a base film can be appropriately used.

When the difference in linear expansion coefficient between the release film 11 and the pressure-sensitive adhesive film 13 is 250 ppm/K or less, a difference in dimensional changes between them is small even when dimensional changes occur in the release film 11 and the pressure-sensitive adhesive film 13 due to transfer from cold storage to ordinary temperature so that the adhesion between the release film 11 and the pressure-sensitive adhesive film 13 is maintained, which makes it possible to prevent the adhesive sheet 10 from getting into a state where air is likely to enter due to the separation between the pressure-sensitive adhesive tape 13 and the release film 11. This makes it possible to store a product at its best without voids or air due to synergistic effect with the void-discharging effect of the through holes 14.

On the other hand, if the difference in linear expansion coefficient between the release film 11 and the pressure-sensitive adhesive film 13 exceeds 250 ppm/K, separation between the pressure-sensitive adhesive tape 13 and the release film 11 is likely to occur, because a difference in dimensional changes between them due to transfer from cold storage to ordinary temperature is large. In this case, air may adversely enter from the outside via the through holes that should be used to discharge voids. However, even when air enters from the outside, there is no problem as long as the through holes are provided in such a place that air is guided to travel toward the outside of the adhesive layer 12, because adhesion recovers at ordinary temperature at which the adhesive sheet 10 is used and therefore air is discharged to the outside of the adhesive layer 12 and does not remain as a void. Even when air remains, there is no problem because air is guided by the through holes 14 to travel toward the outside of the adhesive layer 12 and therefore stays between the pressure-sensitive adhesive tape 13 and the release film 11, and the air between the pressure-sensitive adhesive tape 13 and the release film 11 does not cause defective attachment to a semiconductor wafer. When the through holes 14 are not provided in such a place that air is guided to travel toward the outside of the adhesive layer 12, the adhesive sheet 10 is in a state where void formation is likely to occur. However, even when a void is formed, there is no problem as long as the void is discharged through the through holes 14, and therefore such a state is within an allowance.

As the base film of the pressure-sensitive adhesive film 13, any conventionally-known one can be used without particular limitation. However, when a radiation curable material is used as the pressure-sensitive adhesive layer that will be described later, the base film preferably has radiotransparency.

Examples of the material of the base film include: homopolymers and copolymers of α-olefins such as polyethylene, polypropylene, ethylene-propylene copolymers, polybutene-1, poly-4-methylpentene-1, ethylene-vinyl acetate copolymers, ethylene-ethyl acrylate copolymers, ethylene-methyl acrylate copolymers, ethylene-acrylic acid copolymers, and ionomers and mixtures of two or more of them; and thermoplastic elastomers such as polyurethane, styrene-ethylene-butene or pentene-based copolymers, and polyamide-polyol copolymers and mixtures of two or more of them. Alternatively, the base film may be made of a mixture of two or more materials selected from the group consisting of the above-mentioned materials, and may be a single-layered or multi-layered film made of the two or more materials.

The thickness of the base film is not particularly limited and may be appropriately set, but is preferably 50 μm to 200 μm.

A resin used for the pressure-sensitive adhesive layer of the pressure-sensitive adhesive film 13 is not particularly limited, and a well-known resin used as a pressure-sensitive adhesive such as a chlorinated polypropylene resin, an acrylic resin, a polyester resin, a polyurethane resin, or an epoxy resin can be used. It is preferred that the resin used for the pressure-sensitive adhesive layer 13 is mixed with an acrylic pressure-sensitive adhesive, a radiation-polymerizable compound, a photopolymerization initiator, a curing agent, etc., if necessary to prepare a pressure-sensitive adhesive. The thickness of the pressure-sensitive adhesive layer 13 is not particularly limited and may be appropriately set, but is preferably 5 μm to 30 μm.

Addition of a radiation-polymerizable compound to the pressure-sensitive adhesive layer makes it easy to separate the pressure-sensitive adhesive layer from the adhesive layer by radiation curing. As the radiation-polymerizable compound, for example, a low-molecular-weight compound is used, which has at least two photopolymerizable carbon-carbon double bonds in its molecule that can form a three-dimensional network by light irradiation.

More specifically, trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, or oligoester acrylate can be used.

Besides the above-mentioned acrylate-based compounds, an urethane acrylate-based oligomer can also be used. The urethane acrylate-based oligomer is obtained by reacting a polyester- or polyether-type polyol compound and a polyfunctional isocyanate compound (e.g., 2,4-tolylenediisocyanate, 2,6-tolylenediisocyanate, 1,3-xylylenediisocyanate, 1,4-xylylenediisocyanate, or diphenylmethane-4,4-diisocyanate) to obtain an isocyanate-terminated urethane prepolymer and then reacting the isocyanate-terminated urethane prepolymer and a hydroxyl group-containing acrylate or methacrylate (e.g., 2-hydroxyethyl acrylate, 2-hydroxyethyl methacrylate, 2-hydroxypropyl acrylate, 2-hydroxypropyl methacrylate, polyethylene glycol acrylate, polyethylene glycol methacrylate). The pressure-sensitive adhesive layer may be made of a mixture of two or more selected from the above resins.

When a photopolymerization initiator is used, for example, isopropylbenzoin ether, isobutylbenzoin ether, benzophenone, Michler's ketone, chlorothioxanthone, dodecylthioxanthone, dimethylthioxanthone, diethylthioxanthone, benzyl dimethyl ketal, α-hydroxycyclohexyl phenyl ketone, or 2-hydroxymethylphenylpropane can be used. The amount of such a photopolymerization initiator to be added is preferably 0.01 to 5 parts by mass with respect to 100 parts by mass of an acrylic copolymer.

Hereinbelow, a method for producing the adhesive sheet 10 according to this embodiment will be described.

First, a laminated body is prepared, in which the long pressure-sensitive adhesive film 13 is attached by lamination to the long release film 11 having the adhesive layer 12 with a circular label shape corresponding to the shape of a wafer. It is to be noted that the adhesive layer 12 with a circular label shape may be formed by applying an adhesive varnish onto the release film 11, drying the adhesive varnish, and performing precut processing by stamping the adhesive varnish into a circle and peeling off an unnecessary portion around the circular portion from the release film 11.

Then, precut processing is performed by making cuts in the laminated body from the pressure-sensitive adhesive film 13 side to the middle of the release film 11 in the thickness direction of the release film 11 by a cutting die and peeling off the pressure-sensitive adhesive film 13 from the release film 11 so that the circular label part 13*a* and the peripheral part 13*b* remain.

The through holes may be formed by any method, but are preferably formed concurrently with precutting of the adhesive layer and/or the pressure-sensitive adhesive film. Allowing a blade for precutting to have a blade for forming the through holes 14 makes it possible to form the through holes 14 concurrently with precutting, which makes the process simple. Further, by forming the through holes 14 concurrently with precutting of the adhesive layer 12, air removal can also be performed by utilizing cutting pressure applied during precutting of the pressure-sensitive adhesive film 13 performed later or nip rolls on a path line.

Second Embodiment

Hereinbelow, a second embodiment will be described. An adhesive sheet 10' according to this embodiment has the same structure as the adhesive sheet according to the first embodiment except that a support member 16 is provided, and the same production method as described above with reference to the first embodiment can be applied.

Figure 8A:
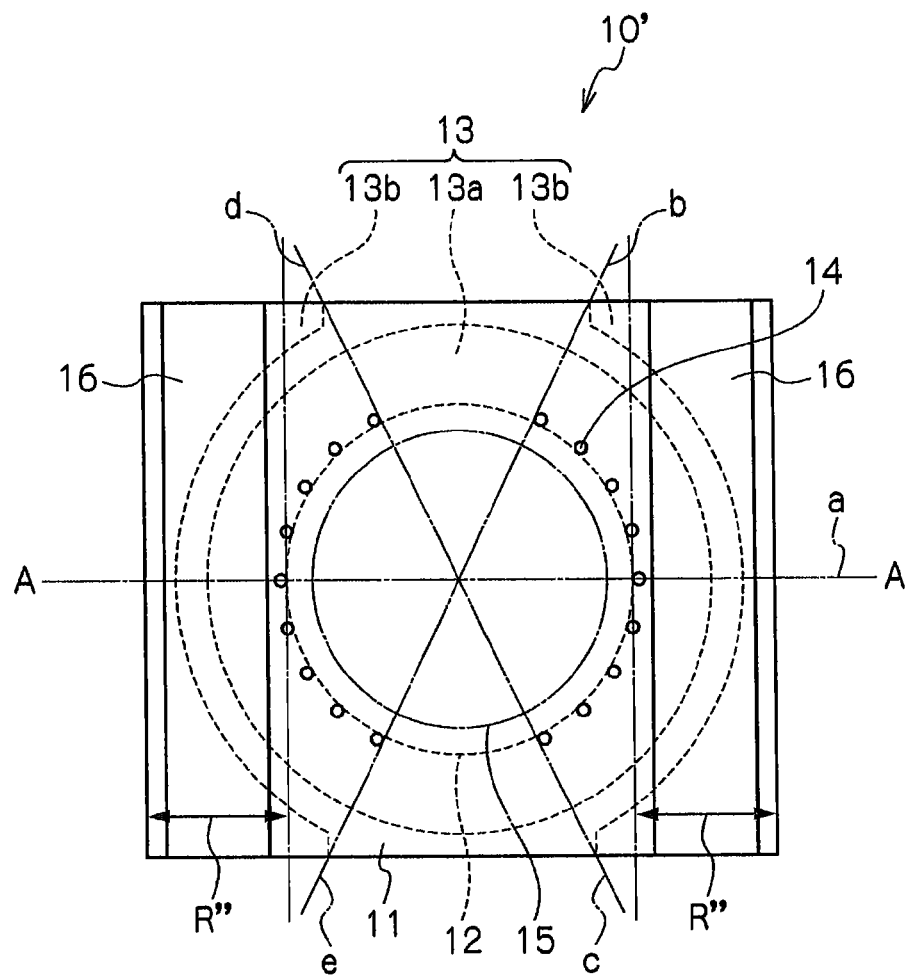
FIG. 8A is a plan view schematically showing the structure of an adhesive sheet according to another embodiment of the present invention.
Figure 8B:
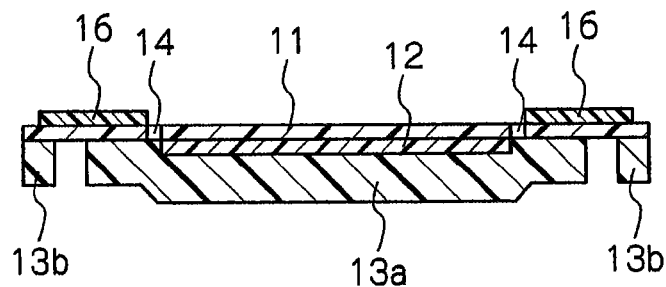
FIG. 8B is a sectional view taken along a line A-A of FIG. 8A.

Hereinbelow, the difference from the first embodiment will be described. As shown in FIG. 8A, the support member 16 is provided at both ends of the release film 11 in the short direction of the release film 11.

The thickness of the support member 16 shall be equal to or larger than a thickness corresponding to a difference in level between an area in which the adhesive layer 12 and the circular label part 13a of the pressure-sensitive adhesive film 13 are laminated together on the release film 11 and the peripheral part 13b of the pressure-sensitive adhesive film 13, that is, equal to or larger than the thickness of the adhesive layer 12. When the support member has such a thickness, a space is created between the pressure-sensitive adhesive film 13 and a second surface 11b of the release film 11 that overlaps the surface of the pressure-sensitive adhesive film 13 when the adhesive sheet 10 is rolled up, which makes it easy to remove a void formed between the adhesive layer and the pressure-sensitive adhesive film.

It is to be noted that the position of the support member 16 is not limited to both ends of the release film 11 in the short direction of the release film 11, and the support member 16 may be provided anywhere as long as the position of the support member 16 corresponds to the outside of the adhesive layer 12. However, from the viewpoint of preventing a transfer mark from being formed on the soft surface of the adhesive layer 12 due to a level difference between an area where the adhesive layer 12 and the circular label part 13a of the pressure-sensitive adhesive film 13 or the support member 16 are laminated together and the peripheral part 13b of the pressure-sensitive adhesive film 13 when the adhesive sheet is wound into a roll to be prepared as a product, the support member 16 is preferably provided in a region R" extending from both ends of the release film 11 in the short direction of the release film 11 to the adhesive layer 12.

Further, the support member 16 is preferably provided on the second surface of the release film 11 opposite to the first surface of the release film 11 on which the adhesive layer 12 and the pressure-sensitive adhesive film 13 are provided. When the support member 16 is provided on the second surface of the release film 11 so as to be located in a position corresponding to the outside of the adhesive layer 12, the through holes 14 that has been used to remove air during precut processing and are no longer necessary can also be blocked with the support member.

When being provided at both ends of the release film 11 in the short direction of the release film 11, the support member 16 can be made intermittent or continuous along the longitudinal direction of the release film 11. However, from the viewpoint of more effectively suppressing the formation of a transfer mark, the support member 16 is preferably provided continuously along the longitudinal direction of the base film 11.

As the support member 16, for example, a pressure-sensitive adhesive tape obtained by applying a pressure-sensitive adhesive onto a resin film base material can be appropriately used. By attaching such a pressure-sensitive adhesive tape to a predetermined position at both ends of the second surface of the release film 11, the adhesive sheet 10' according to this embodiment can be formed. The pressure-sensitive adhesive tape to be attached may be single-layered or may be formed by laminating thin tapes.

The resin film base material of the pressure-sensitive adhesive tape is not particularly limited, but, in terms of heat resistance, smoothness, and availability, is preferably selected from polyethylene terephthalate (PET), polypropylene, and high-density polyethylene. The composition and physical properties of the pressure-sensitive adhesive of the pressure-sensitive adhesive tape are not particularly limited as long as the pressure-sensitive adhesive tape is not separated from the release film 11 in the rolling-up process and storage process of the adhesive sheet 10.

EXAMPLES

Hereinbelow, the present invention will be described in more detail based on examples, but is not limited to these examples.

Pressure-sensitive adhesive compositions and adhesive compositions were prepared in the following manner, and adhesive sheets were prepared by the following methods and their performance was evaluated.

(Preparation of Pressure-Sensitive Adhesive Composition)
<Pressure-Sensitive Adhesive Composition 1>

A mixture of 340 g of isooctyl acrylate, 13 g of methyl methacrylate, 60 g of hydroxyacrylate, 0.5 g of methacrylic acid, and benzoyl peroxide as a polymerization initiator was added to 400 g of toluene as a solvent while the amount of the mixture dropped to the toluene was appropriately adjusted, and reaction temperature and reaction time were adjusted to obtain a solution of a compound (1) having a weight average molecular weight of 800,000. Then, 2 parts by weight of CORONATE L (manufactured by Nippon Polyurethane Industry Co., Ltd.) as polyisocyanate and 300 parts by weight of ethyl acetate as a solvent with respect to 100 parts by weight of the compound (1) in the solution were added to the solution of the compound (1) with stirring to obtain a pressure-sensitive adhesive composition 1.

<Pressure-Sensitive Adhesive Composition 2>

2.5 grams of 2-isocyanate ethyl methacrylate as a compound having radiation curable carbon-carbon double bond and functional group and hydroquinone as a polymerization inhibitor were added to the solution of the compound (1) while the amount of the hydroquinone dropped to the solution was appropriately adjusted, and reaction temperature and reaction time were adjusted to obtain a solution of a compound (2) having a radiation curable carbon-carbon double bond. The Tg of the compound (2) was measured by DSC and was found to be −49° C. Then, 2 parts by weight of CORONATE L as polyisocyanate, 1 part by weight of IRGACURE 184 (manufactured by Nihon Ciba-Geigy K.K.) as a photopolymerization initiator, and 300 parts by weight of ethyl acetate as a solvent with respect to 100 parts by weight of the compound (2) in the solution were added to the solution of the compound (2) with stirring to obtain a pressure-sensitive adhesive composition 2.

(Preparation of Pressure-Sensitive Adhesive Film)
<Pressure-Sensitive Adhesive Film 1A>

The pressure-sensitive adhesive composition 1 was applied onto a release film constituted from a release-treated polyethylene terephthalate film to achieve a dry film thickness of 25 μm and dried at 110° C. for 3 minutes, and was then attached to an 80 μm-thick low-density polyethylene film extruded at 180° C. to prepare a pressure-sensitive adhesive film 1A having a linear expansion coefficient of 260 ppm/K. The linear expansion coefficient was measured using a thermomechanical analyzer (manufactured by Rigaku Corporation) under the following conditions, and was determined in the range of −20° C. to +20° C.

<<Measurement Conditions>>
Instrument: TMA8310 manufactured by Rigaku Corporation
Temperature range: −30° C. to 50° C.
Temperature rise rate: 5° C./min
Measuring load: 49 mN
Atmosphere gas: N2

<Pressure-Sensitive Adhesive Film 1B>

The pressure-sensitive adhesive composition 2 was applied onto a release film constituted from a release-treated polyethylene terephthalate film to achieve a dry film thickness of 10 μm and dried at 110° C. for 3 minutes, and was then attached to an 80 μm-thick ethylene-vinyl acetate copolymer film extruded at 180° C. to prepare a pressure-sensitive adhesive film 1B having a linear expansion coefficient of 300 ppm/K. The linear expansion coefficient was measured in the same manner as described above.

<Pressure-Sensitive Adhesive Film 1C>

The pressure-sensitive adhesive composition 1 was applied onto a release film constituted from a release-treated polyethylene terephthalate film to achieve a dry film thickness of 10 μm and dried at 110° C. for 3 minutes, and was then attached to a 100 μm-thick vinyl chloride film extruded at 170° C. to prepare a pressure-sensitive adhesive film 1C having a linear expansion coefficient of 380 ppm/K. The linear expansion coefficient was measured in the same manner as described above.

(Release Film)
<Release Film 2A>

A release-treated polyethylene terephthalate film having a thickness of 38 μm was used. The linear expansion coefficient of the film was measured using a thermomechanical analyzer (manufactured by Rigaku Corporation) in the same manner as the measurement of the linear expansion coefficient of the pressure-sensitive adhesive film, and was found to be 60 ppm/K.

<Release Film 2B>

A release-treated polypropylene film having a thickness of 38 μm was used. The linear expansion coefficient of the film was measured using a thermomechanical analyzer (manufactured by Rigaku Corporation) in the same manner as the measurement of the linear expansion coefficient of the pressure-sensitive adhesive film, and was found to be 120 ppm/K.

(Preparation of Adhesive Composition)
<Adhesive Composition>

A composition containing 15 parts by mass of a cresol novolac-type epoxy resin (epoxy equivalent: 197, molecular weight: 1200, softening point: 70° C.), 70 parts by mass of acrylic resin SG-P3 (manufactured by Nagase Chemtex Corporation, mass average molecular weight: 850,000, glass transition temperature: 12° C.), 15 parts by mass of a phenol novolac resin (hydroxyl group equivalent: 104, softening point: 80° C.) as a curing agent, and 1 part of CUREZOL 2PZ (manufactured by SHIKOKU CHEMICALS CORPORATION, trade name: 2-phenylimidazole) as an accelerator was mixed with cyclohexanone with stirring and further kneaded using a bead mill for 90 minutes to obtain an adhesive composition.

(Formation of Adhesive Layer)
<Adhesive Layer A>

The adhesive composition was applied onto the release film 2A or the release film 2B to achieve a dry film thickness of 40 μm and heat-dried at 110° C. for 1 minute to form a coating film in B-stage (intermediate stage during curing of thermosetting resin). In this way, an adhesive layer 3A was obtained. The adhesive layer 3A was cold-stored.

<Adhesive Layer B>

The adhesive composition was applied onto the release film 2A or the release film 2B to achieve a dry film thickness of 120 μm and heat-dried at 110° C. for 1 minute to form a coating film in B-stage (intermediate stage during curing of thermosetting resin). In this way, an adhesive layer 3B was obtained. The adhesive layer 3B was cold-stored.

(Preparation of Adhesive Sheet)

The cold-stored release film 2A having the adhesive layer 3A formed thereon was returned to ordinary temperature, and precut processing was performed by adjusting the depth of a cut made in the release film 2A to 15 μm or less so that the adhesive layer 3A was cut into a circle having a diameter of 220 mm (circumference: about 691 mm). Then, 32 through holes having a shape shown in FIG. 9A were provided in the release film 2A from the side opposite to the adhesive layer 3A so as to be located in a place shown in FIG. 10A, and an unnecessary portion of the adhesive layer 3A was removed and the pressure-sensitive adhesive film 1A was laminated on the release film 2A at room temperature so that the pressure-sensitive adhesive layer thereof came into contact with the adhesive layer 3A. Then, precut processing was performed by adjusting the depth of a cut made in the release film 2A to 15 μm or less so that the pressure-sensitive adhesive film 1A was cut into a circle having a diameter of 270 mm so as to be concentric with the adhesive layer. In this way, an adhesive sheet of Example 1 was prepared.

An adhesive sheet according to Example 14 was prepared in the same manner as in Example 1 in accordance with a combination shown in the following Table 3.

Figure 9A:
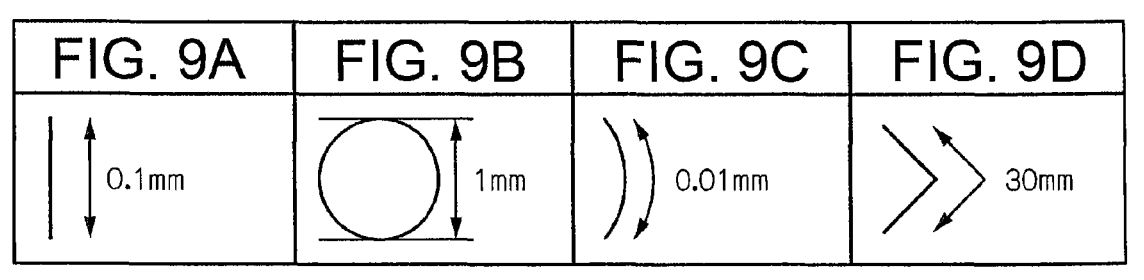
Figure 10A:
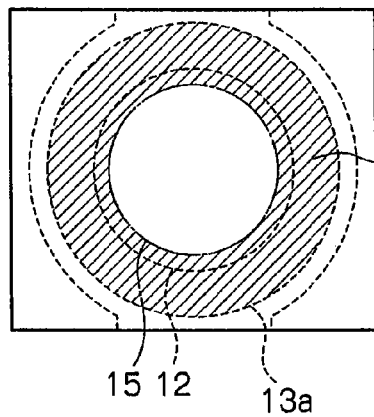
FIGS. 10A to 10F are diagrams showing a place where through holes are provided in an adhesive sheet according to Example or Comparative Example of the present invention.
Figure 10B:
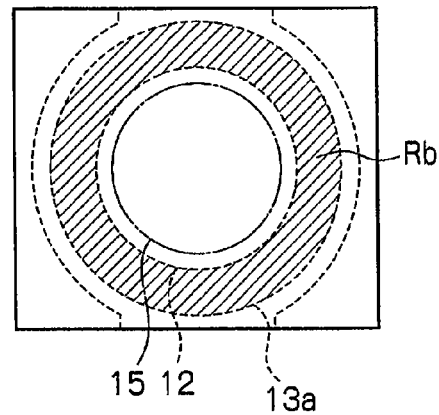

The cold-stored release film 2B having the adhesive layer 3A formed thereon was returned to ordinary temperature, and precut processing was performed by adjusting the depth of a cut made in the release film 2B to 15 μm or less so that the adhesive layer 3A was cut into a circle having a diameter of 220 mm (circumference: about 691 mm), and at the same time, 6 through holes having a shape shown in FIG. 9B were provided in the release film 2B so as to be located in a place shown in FIG. 10B. Then, an unnecessary portion of the adhesive layer 3A was removed, and the pressure-sensitive adhesive film 1B was laminated on the release film 2B at room temperature so that the pressure-sensitive adhesive layer thereof came into contact with the adhesive layer 3A. Then, precut processing was performed by adjusting the depth of a cut made in the release film 2B to 15 μm or less so that the pressure-sensitive adhesive film 1B was cut into a circle having a diameter of 270 mm so as to be concentric with the adhesive layer. In this way, an adhesive sheet of Example 2 was prepared.

Adhesive sheets according to Examples 3 to 13 and 15 to 19 were prepared in the same manner as in Example 2 in accordance with combinations shown in the following Tables 1 to 3.

The cold-stored release film 2B having the adhesive layer 3A formed thereon was returned to ordinary temperature, and precut processing was performed by adjusting the depth of a cut made in the release film 2B to 15 μm or less so that the adhesive layer 3A was cut into a circle having a diameter of 220 mm (circumference: about 691 mm). Then, an unnecessary portion of the adhesive layer 3A was removed, and the pressure-sensitive adhesive film 1B was laminated on the release film 2B at room temperature so that the pressure-sensitive adhesive layer thereof came into contact with the adhesive layer 3A. Then, precut processing was performed by adjusting the depth of a cut made in the release film 2A to 15 μm or less so that the pressure-sensitive adhesive film 1A was cut into a circle having a diameter of 270 mm so as to be concentric with the adhesive layer. In this way, an adhesive sheet of Comparative Example 1 was prepared.

The cold-stored release film 2A having the adhesive layer 3A formed thereon was returned to ordinary temperature, and precut processing was performed by adjusting the depth of a cut made in the release film 2A to 15 μm or less so that the adhesive layer 3A was cut into a circle having a diameter of 220 mm (circumference: about 691 mm). Then, an unnecessary portion of the adhesive layer 3A was removed, and the pressure-sensitive adhesive film 1A was laminated on the release film 2A at room temperature so that the pressure-sensitive adhesive layer thereof came into contact with the adhesive layer 3A. Then, precut processing was performed by adjusting the depth of a cut made in the release film 2A to 15 μm or less so that the pressure-sensitive adhesive film 1A was cut into a circle having a diameter of 270 mm so as to be concentric with the adhesive layer, and at the same time, 4 through holes having a shape shown in FIG. 9A were provided in the pressure-sensitive adhesive film 1A so as to be located in a place shown in FIG. 10A. In this way, an adhesive sheet of Comparative Example 2 was prepared.

Adhesive sheets according to Examples 3 to 11 were prepared in the same manner as in Comparative Example 2 in accordance with combinations shown in the following Tables 4 and 5.

It is to be noted that a through hole shown in FIG. 9A has a line shape having a maximum width (length from start point to end point) of 0.1 mm, and a through hole shown in FIG. 9B has a circular shape having a maximum width (diameter) of 1 mm. Further, a through hole shown in FIG. 9C has an arc shape having a maximum width (length from start point to end point) of 0.01 mm, and a through hole shown in FIG. 9D has a V-shape having a maximum width (length from start point to end point) of 30 mm.

The place shown in FIG. 10A in which through holes are provided is a portion corresponding to the outside of a part of the adhesive layer intended to be attached to an adherend and the inside of the circular label part, that is, a diagonally-shaded region Ra in FIG. 10A. The place shown in FIG. 10B in which through holes are provided is a portion corresponding to the outside of the outer edge of the adhesive layer and the inside of the circular label part, that is, a diagonally-shaded region Rb in FIG. 10B. The place shown in FIG. 10O in which through holes are provided is a portion corresponding to the outer edge of the adhesive layer, that is, a region Rc shown by a solid line in FIG. 10O. The place shown in FIG. 10D in which through holes are provided is a portion that corresponds to the outside of the outer edge of the adhesive layer and the inside of the circular label part and that is within an area of ±60° or less around the center of the adhesive layer with respect to a straight line a passing through the center of the adhesive layer and perpendicular to the longitudinal direction of the release film, that is, a diagonally-shaded region Rd in FIG. 10D. The place shown in FIG. 10E in which through holes are provided is a portion that corresponds to the outer edge of the adhesive layer and that is within an area of ±45° or less around the center of the adhesive layer with respect to a straight line a passing through the center of the adhesive layer and perpendicular to the longitudinal direction of the release film, that is, a region Re shown by a solid line in FIG. 10E. The place shown in FIG. 10F in which through holes are provided is a portion that corresponds to the outside of the outer edge of the adhesive layer and the inside of the circular label part and that is within an area of ±45° or less around the center of the adhesive layer with respect to a straight line a passing through the center of the adhesive layer and perpendicular to the longitudinal direction of the release film, that is, a diagonally-shaded region Rf in FIG. 10F.

In Examples, the through holes were provided in the release film so as to be located in the place shown in FIG. 10, and in Comparative Examples 2 to 11, the through holes were provided in the pressure-sensitive adhesive layer so as to be located in the place shown in FIG. 10.

In all the cases shown in FIGS. 10A to 10F, the through hole shown in FIG. 9A was provided so that the longitudinal direction of the through hole was parallel to a tangent to the circle of label of the adhesive layer or the pressure-sensitive adhesive film. Further, in all the cases shown in FIGS. 10 A to 10F, the through hole shown in FIG. 9C or 9D was provided so that the convex side of the through hole was directed to the outside of the circle of the label.

The through holes were provided at regular intervals, and when provided in the place shown in FIG. 10A, 10B, 10D, or 10F, the through holes were radially arranged.

(Characteristics Evaluation Tests)

The pressure-sensitive adhesive tapes for wafer processing of Examples 1 to 19 and Comparative Examples 1 to 11 were subjected to characteristics evaluation tests in the following manner.

<Evaluation of Void Formation-Suppressing Ability>

Each of the pressure-sensitive adhesive tapes for wafer processing of Examples and Comparative Examples was wound into a roll having 300 circular pressure-sensitive adhesive films to prepare a roll of pressure-sensitive adhesive tape for wafer processing. The obtained rolls of pressure-sensitive adhesive tape for wafer processing were stored in a refrigerator (5° C.) for 1 month and were then wrapped, packed, and put in a transport truck to make a round trip between Hiratsuka and Kobe (about 1,000 km). The container of the truck was kept cold at −20° C. by dry ice. Then, the adhesive sheet rolls were unpacked, and the rolls of pressure-sensitive adhesive tape for wafer processing were returned to ordinary temperature and then unwrapped to evaluate the ability of the pressure-sensitive adhesive tapes for wafer processing of Examples and Comparative Examples to suppress void formation. The pressure-sensitive adhesive tapes for wafer processing were visually observed to determine whether or not void formation occurred, and their ability to suppress void formation was evaluated according to the following four criteria ●, ○, Δ, and x.

● (excellent): No voids and no air were observed from every angle by the naked eye.

○ (good): Air was slightly observed between the pressure-sensitive adhesive film and the release film.

Δ (acceptable): Air was slightly observed between the adhesive layer and the release film.

x (defective): Void formation was observed between the adhesive layer and the pressure-sensitive adhesive film.

<Evaluation of Expandability>

Expandability was evaluated in the following manner using the labels with no voids in which the adhesive layer and the pressure-sensitive adhesive film were laminated together. The adhesive layer of the label was attached to a 75 μm-thick semiconductor wafer by heating at 70° C. for 1 minute, and the semiconductor wafer was fixed to a ring frame and diced into chips of 10 mm×10 mm. Then, only the adhesive sheets using the pressure-sensitive adhesive film 1B (Examples 2, 5, 11, and 13 and Comparative Examples 1 and 6) were irradiated with ultraviolet rays at 200 mJ/cm$^2$ by an air-cooled high-pressure mercury lamp (80 W/cm, irradiation distance: 10 cm). The adhesive sheets with semiconductor wafer were expanded by a die bonder so that the amount of expansion was 15 mm and the speed of expansion was 30 mm/sec to evaluate their expandability. The expandability was evaluated according to the following two criteria ○ and x.

○ (good): Expansion can be performed without tearing the pressure-sensitive adhesive film.

x (defective): A tear of the pressure-sensitive adhesive film was observed.

The results of the above tests of each of Examples and Comparative Examples are shown in Tables 1 to 5.

TABLE 1

Figure 10C:
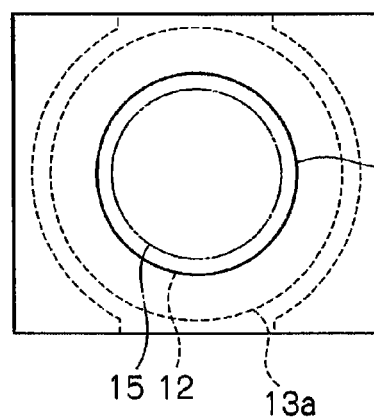
Figure 10D:
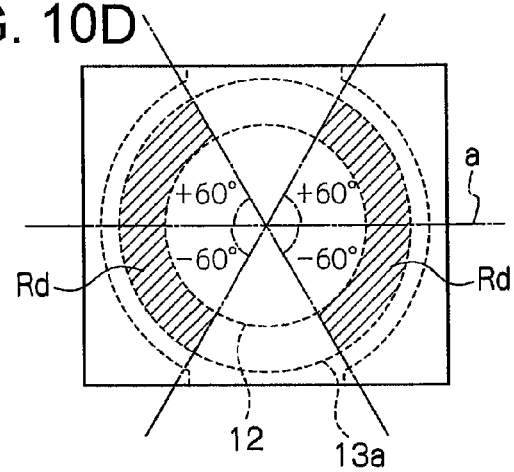
Figure 10E:
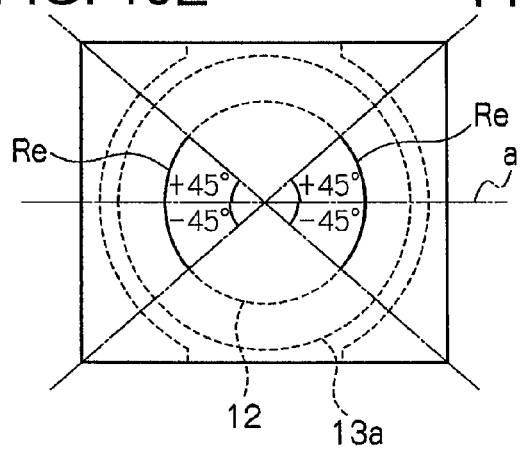
Figure 10F:
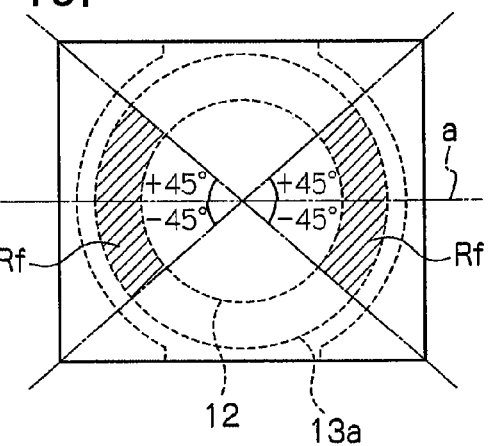
Figure 11:
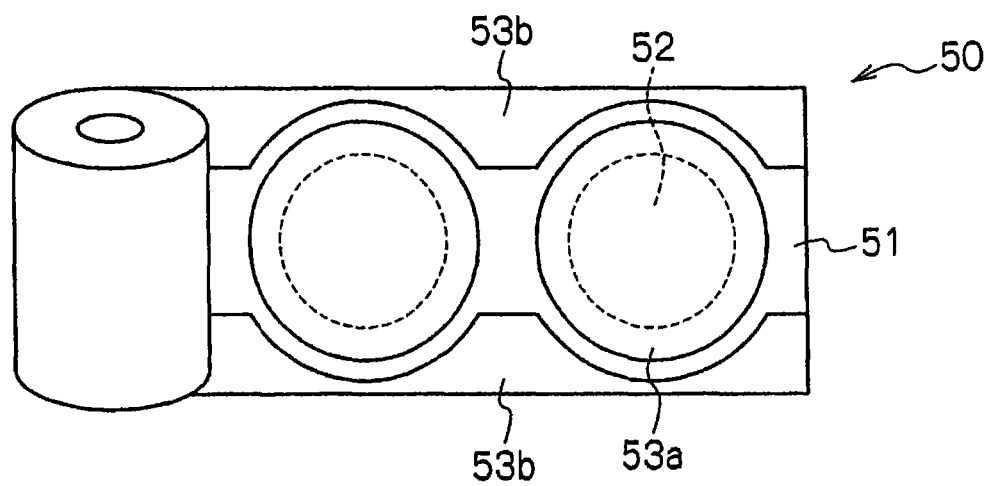
FIG. 11 is a schematic perspective view of a conventional adhesive sheet wound into a roll.
Figure 12A:
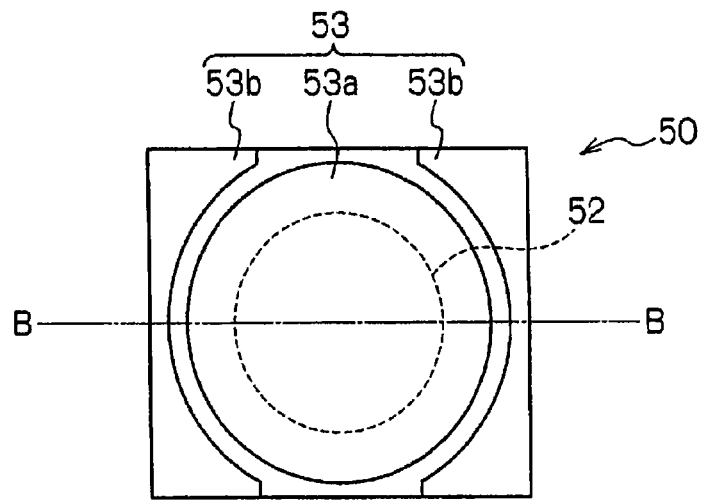
FIG. 12A is a plan view showing the structure of the conventional adhesive sheet.
Figure 12B:
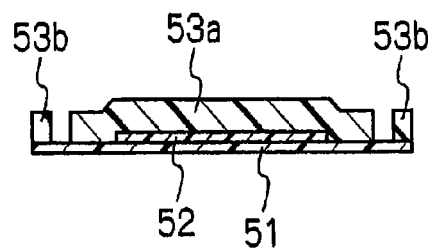
FIG. 12B is a sectional view taken along a line B-B of FIG. 12A.
Figure 13:
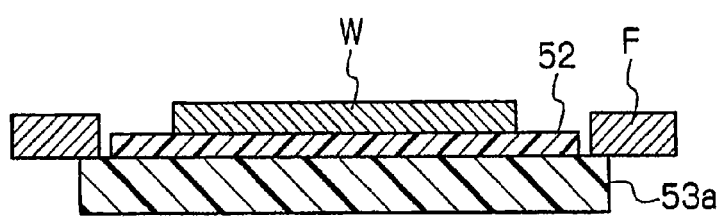
FIG. 13 is a sectional view showing a state where the conventional adhesive sheet and a ring frame for dicing are attached together.

| | | Example 1 | Example 2 | Example 3 | Example 4 | Example 5 | Example 6 |
|---|---|---|---|---|---|---|---|
| Through hole | Place | Release film FIG. 10A | Release film FIG. 10B | Release film FIG. 10C | Release film FIG. 10D | Release film FIG. 10E | Release film FIG. 10F |
| | Shape | FIG. 9A | FIG. 9B | FIG. 9B | FIG. 9A | FIG. 9A | FIG. 9A |
| | Maximum diameter (mm) | 0.1 | 1 | 1 | 0.1 | 0.1 | 0.1 |
| | Number | 32 | 6 | 64 | 80 | 100 | 16 |
| Pressure-sensitive adhesive film | | 1A | 1B | 1A | 1A | 1B | 1A |
| Release film | | 2A | 2B | 2A | 2A | 2A | 2B |
| Adhesive layer | | 3A | 3A | 3A | 3A | 3A | 3A |
| Difference in linear expansion coefficient (ppm) | | 200 | 180 | 200 | 200 | 240 | 140 |
| Results | Void formation-suppressing ability | ⊙ | ⊙ | ⊙ | ⊙ | ⊙ | ⊙ |
| | Expandability | ○ | ○ | ○ | ○ | ○ | ○ |

TABLE 2

| | | Example 7 | Example 8 | Example 9 | Example 10 | Example 11 | Example 12 | Example 13 |
|---|---|---|---|---|---|---|---|---|
| Through hole | Place | Release film FIG. 10E | Release film FIG. 10E | Release film FIG. 10E | Release film FIG. 10E | Release film FIG. 10D | Release film FIG. 10E | Release film FIG. 10F |
| | Shape | FIG. 9D | FIG. 9D | FIG. 9C | FIG. 9C | FIG. 9A | FIG. 9B | FIG. 9A |
| | Maximum diameter (mm) | 30 | 30 | 0.01 | 0.01 | 0.1 | 1 | 0.1 |
| | Number | 10 | 6 | 150 | 8 | 64 | 64 | 64 |
| Pressure-sensitive adhesive film | | 1A | 1A | 1A | 1A | 1B | 1A | 1B |
| Release film | | 2A | 2A | 2A | 2A | 2B | 2B | 2A |
| Adhesive layer | | 3A | 3A | 3A | 3A | 3B | 3B | 3B |
| Difference in linear expansion coefficient (ppm) | | 200 | 200 | 200 | 200 | 180 | 140 | 240 |
| Results | Void formation-suppressing ability | ⊙ | ⊙ | ⊙ | ⊙ | ⊙ | ⊙ | ⊙ |
| | Expandability | ○ | ○ | ○ | ○ | ○ | ○ | ○ |

TABLE 3

| | | Example 14 | Example 15 | Example 16 | Example 17 | Example 18 | Example 19 |
|---|---|---|---|---|---|---|---|
| Through hole | Place | Release film FIG. 10A | Release film FIG. 10B | Release film FIG. 10C | Release film FIG. 10D | Release film FIG. 10E | Release film FIG. 10F |
| | Shape | FIG. 9A | FIG. 9B | FIG. 9A | FIG. 9B | FIG. 9A | FIG. 9B |
| | Maximum diameter (mm) | 0.1 | 1 | 0.1 | 1 | 0.1 | 1 |
| | Number | 64 | 64 | 64 | 64 | 64 | 64 |

TABLE 3-continued

|  |  | Example 14 | Example 15 | Example 16 | Example 17 | Example 18 | Example 19 |
|---|---|---|---|---|---|---|---|
| Pressure-sensitive adhesive film |  | 1C | 1C | 1C | 1C | 1C | 1C |
| Release film |  | 2B | 2A | 2A | 2A | 2B | 2B |
| Adhesive layer |  | 3A | 3A | 3A | 3A | 3A | 3A |
| Difference in linear expansion coefficient (ppm) |  | 260 | 320 | 320 | 320 | 260 | 260 |
| Results | Void formation-suppressing ability | Δ | Δ | Δ | ○ | ○ | ○ |
|  | Expandability | ○ | ○ | ○ | ○ | ○ | ○ |

TABLE 4

|  |  | Comparative Example 1 | Comparative Example 2 | Comparative Example 3 | Comparative Example 4 | Comparative Example 5 | Comparative Example 6 |
|---|---|---|---|---|---|---|---|
| Through hole | Place | None | Pressure-sensitive adhesive film | Pressure-sensitive adhesive film | Pressure-sensitive adhesive film | Pressure-sensitive adhesive film | Pressure-sensitive adhesive film |
|  |  | None | FIG. 10(b) | FIG. 10C | FIG. 10D | FIG. 10E | FIG. 10F |
|  | Shape | None | FIG. 9C | FIG. 9C | FIG. 9C | FIG. 9C | FIG. 9C |
|  | Maximum diameter (mm) | None | 0.01 | 0.01 | 0.01 | 0.01 | 0.01 |
|  | Number | 0 | 4 | 4 | 4 | 4 | 4 |
| Pressure-sensitive adhesive film |  | 1B | 1A | 1A | 1A | 1A | 1B |
| Release film |  | 2B | 2A | 2B | 2A | 2A | 2A |
| Adhesive layer |  | 3A | 3A | 3A | 3A | 3A | 3A |
| Difference in linear expansion coefficient (ppm) |  | 180 | 200 | 140 | 200 | 200 | 240 |
| Results | Void formation-suppressing ability | x | ⊙ | ⊙ | ⊙ | ⊙ | ⊙ |
|  | Expandability | ○ | x | x | x | x | x |

TABLE 5

|  |  | Comparative Example 7 | Comparative Example 8 | Comparative Example 9 | Comparative Example 10 | Comparative Example 11 |
|---|---|---|---|---|---|---|
| Through hole | Place | Pressure-sensitive adhesive film FIG. 10B | Pressure-sensitive adhesive film FIG. 10C | Pressure-sensitive adhesive film FIG. 10D | Pressure-sensitive adhesive film FIG. 10E | Pressure-sensitive adhesive film FIG. 10F |
|  | Shape | FIG. 9A | FIG. 9B | FIG. 9A | FIG. 9B | FIG. 9A |
|  | Maximum diameter (mm) | 0.1 | 1 | 0.1 | 1 | 0.1 |
|  | Number | 64 | 64 | 64 | 64 | 64 |
| Pressure-sensitive adhesive film |  | 1C | 1C | 1C | 1C | 1C |
| Release film |  | 2B | 2B | 2A | 2A | 2B |
| Adhesive layer |  | 3A | 3A | 3A | 3A | 3A |
| Difference in linear expansion coefficient (ppm) |  | 260 | 260 | 320 | 320 | 260 |
| Results | Void formation-suppressing ability | Δ | Δ | ○ | ○ | ○ |
|  | Expandability | x | x | x | x | x |

As shown in Tables 1 to 3, in Examples 1 to 19, the through holes penetrating the release film were provided in a place including a portion corresponding to the outside of a part of the adhesive layer intended to be attached to an adherend and the inside of the label part, and therefore expansion could be successfully performed even when the amount and rate of expansion were increased.

Further, as shown in Tables 1 and 2, in Examples 1 to 13, the difference in linear expansion coefficient between the release film and the pressure-sensitive adhesive film was 250 ppm/K or less, and therefore void formation could be very successfully suppressed. As shown in Table 3, in Examples 17 to 19, the difference in linear expansion coefficient between the release film and the pressure-sensitive adhesive film exceeded 250 ppm/K, and therefore entry of air was observed. However, the through holes were provided within a limited area of ±60° around the center of the adhesive layer with respect to a straight line a passing through the center of the adhesive layer and perpendicular to the longitudinal direction of the release film, and therefore, although air slightly remained between the pressure-sensitive adhesive film and the release film, void formation responsible for defective attachment to a wafer could be successfully suppressed. As shown in Table 3, in Examples 14 to 16, the difference in linear expansion coefficient between the release film and the pressure-sensitive adhesive film exceeded 250 ppm/K, and therefore the entry of air was observed. Further, the through holes were provided within an area of ±90° around the center of the adhesive layer with respect to a straight line a passing through the center of the adhesive layer and perpendicular to the longitudinal direction of the release film, and therefore the amount of air entering was large and air was observed also between the adhesive layer and the release film. As described above, in the adhesive sheets of Examples 14 to 16, air is not guided to travel toward the outside of the adhesive layer 12 and therefore void formation is likely to occur. However, void formation was not observed due to the void-discharging effect of the through holes, and therefore the adhesive sheets of Examples 14 to 16 were evaluated acceptable.

On the other hand, as shown in Table 4, in Comparative Example 1, expandability was good due to the absence of through holes, but void formation was observed between the adhesive layer and the pressure-sensitive adhesive film. Further, as shown in Tables 4 and 5, in Comparative Examples 2 to 11, the through holes were provided in the pressure-sensitive adhesive film, and therefore the pressure-sensitive adhesive film was torn by expansion when the amount and rate of expansion were large.

It is to be noted that as shown in Table 4, in Comparative Examples 2 to 6, the difference in linear expansion coefficient between the release film and the pressure-sensitive adhesive film was 250 ppm/K or less, and therefore void formation was very successfully suppressed. On the other hand, as shown in Table 5, in Comparative Examples 9 to 11, the difference in linear expansion coefficient between the release film and the pressure-sensitive adhesive film exceeded 250 ppm/K, and therefore air was slightly observed between the pressure-sensitive adhesive film and the release film, but void formation was not observed. As shown in Table 5, in Comparative Examples 7 and 8, the difference in linear expansion coefficient between the release film and the pressure-sensitive adhesive film exceeded 250 ppm/K, and therefore the entry of air was observed. Further, the through holes were provided within an area of ±90° around the center of the adhesive layer with respect to a straight line a passing through the center of the adhesive layer and perpendicular to the longitudinal direction of the release film, and therefore air was observed also between the adhesive layer and the release film.

As can be seen from these Examples and Comparative Examples, the adhesive sheet according to the present invention can suppress void formation between the adhesive layer and the pressure-sensitive adhesive film to reduce the occurrence of defective attachment to a semiconductor wafer, and can be successfully expanded without tearing the pressure-sensitive adhesive film even when the amount and/or rate of expansion are/is increased.

REFERENCE SIGNS LIST 10, 10': Adhesive sheet
11: Release film
12: Adhesive layer
13: Pressure-sensitive adhesive film
13a: Circular label part
13b: Peripheral part
14: Through hole
15: Part intended to be attached to adherend
16: Support member

The invention claimed is:

1. An adhesive sheet wound into a roll, comprising:
a long release film;
an adhesive layer provided in a plurality of label forms on the release film, said adhesive layer comprising a plurality of individual adhesive layer units separately situated along the long release film; and
a pressure-sensitive adhesive film comprising
a plurality of label parts each covering an individual adhesive layer unit and provided so as to be in contact with the release film around the individual adhesive layer unit, and
a peripheral part surrounding an outside of the plurality of label parts, said peripheral part situated along the long release film,
wherein:
at least one through hole penetrating the entire thickness of the release film is provided in a place on the release film including a portion corresponding to an outside of a part of each individual adhesive layer unit intended to be attached to an adherend, and also corresponding to an inside of each label part; and
the at least one through hole does not penetrate the pressure-sensitive adhesive film.

2. The adhesive sheet according to claim 1, wherein a difference in linear expansion coefficient between the release film and the pressure-sensitive adhesive film is 250 ppm/K or less.

3. The adhesive sheet according to claim 1, wherein the through hole is provided within an area of ±60° or less around a center of the adhesive layer with respect to a straight line passing through the center of the adhesive layer and perpendicular to a longitudinal direction of the release film.

4. The adhesive sheet according to claim 1, further comprising a support member provided outside the plurality of label parts of the pressure-sensitive adhesive film along the longitudinal direction.

5. The adhesive sheet according to claim 1, wherein each individual adhesive layer unit has a planar shape corresponding to the adherend to which the individual adhesive layer unit is to be attached after the release film is peeled off, said planar shape corresponding to a shape occurring after the roll is unwound.

6. The adhesive sheet according to claim 1, wherein the pressure-sensitive adhesive film has a planar shape corresponding to an adherend to which the pressure-sensitive adhesive film is to be attached after the release film is peeled off, said planar shape corresponding to a shape occurring after the roll is unwound.

7. The adhesive sheet according to claim 1, wherein the at least one through hole is provided in a place including a portion in contact with an outer edge of the adhesive layer.

8. The adhesive sheet according to claim 1, wherein:
each label form on the release film comprises a plurality of through holes; and
the plurality of through holes at each label form satisfies the relationship:

$$(MW \times \#T) < OC$$

wherein:
MW represents a maximum width of the through holes;
T represents the number of through holes at each label form; and
OC represents an outer circumference of the individual adhesion layer unit at each label form.

9. The adhesive sheet according to claim 1, wherein:
each label form on the release film comprises a plurality of through holes; and
the plurality of through holes at each label form satisfies the relationship:

$$(MW \times \#T) < (\tfrac{2}{3} \times OC)$$

wherein:
MW represents a maximum width of the through holes;
T represents the number of through holes at each label form; and
OC represents an outer circumference of the individual adhesion layer unit at each label form.

* * * * *